(12) United States Patent  (10) Patent No.: US 7,705,672 B1
Rodriguez  (45) Date of Patent: Apr. 27, 2010

(54) BUCK CONVERTERS AS POWER AMPLIFIER

(76) Inventor: Manuel De Jesus Rodriguez, 6234 Wynne Ave., Glendale, CA (US) 91335

(*) Notice: Subject to any disclaimer, the term of this patent is extended or adjusted under 35 U.S.C. 154(b) by 114 days.

(21) Appl. No.: 12/069,461

(22) Filed: Feb. 9, 2008

Related U.S. Application Data

(60) Provisional application No. 60/900,839, filed on Feb. 12, 2007.

(51) Int. Cl.
H03F 3/68 (2006.01)
(52) U.S. Cl. ...................... 330/10; 330/207 A
(58) Field of Classification Search ............ 330/10, 330/207 A, 251
See application file for complete search history.

(56) References Cited

U.S. PATENT DOCUMENTS

| | | | |
|---|---|---|---|
| 3,629,616 A | 12/1971 | Wlker | |
| 4,531,096 A | 7/1985 | Yokoyama | |
| 5,014,016 A | 5/1991 | Anderson | |
| 5,115,205 A * | 5/1992 | Holmes, Jr. ............... | 330/10 |
| 5,160,896 A | 11/1992 | McCorkle | |
| 5,617,058 A | 4/1997 | Adrian et al. | |
| 5,767,740 A * | 6/1998 | Fogg ..................... | 330/10 |
| 5,805,020 A | 9/1998 | Danz et al. | |
| 5,818,207 A | 10/1998 | Hwang | |
| 5,838,193 A | 11/1998 | Myers et al. | |
| 5,959,442 A | 9/1999 | Hallberg et al. | |
| 5,963,086 A | 10/1999 | Hall | |
| 5,973,368 A | 10/1999 | Pearce et al. | |
| 5,982,231 A | 11/1999 | Nalbant | |
| 6,016,075 A | 1/2000 | Hamo | |
| 6,072,361 A | 6/2000 | Myers et al. | |
| 6,078,214 A | 6/2000 | Zhang | |
| 6,091,292 A | 7/2000 | Higashiyama et al. | |
| 6,097,249 A | 8/2000 | Strickland et al. | |
| 6,229,388 B1 | 5/2001 | Nalbant | |
| 6,246,283 B1 | 6/2001 | Ahuja et al. | |
| 6,282,747 B1 | 9/2001 | Morgan et al. | |
| 6,297,692 B1 | 10/2001 | Nielsen | |
| 6,356,151 B1 | 3/2002 | Nalbant | |
| 6,429,737 B1 | 8/2002 | O'Brien | |
| 6,498,531 B1 | 12/2002 | Ulrick et al. | |
| 6,563,377 B2 * | 5/2003 | Butler ..................... | 330/10 |
| 6,794,932 B1 | 9/2004 | Butler | |
| 7,151,404 B2 * | 12/2006 | Lee et al. ................. | 330/10 |
| 7,319,763 B2 * | 1/2008 | Bank et al. ............... | 330/10 |
| 7,355,473 B2 * | 4/2008 | Wu ........................ | 330/10 |

* cited by examiner

Primary Examiner—Khanh V Nguyen
(74) Attorney, Agent, or Firm—Peter Ganjian (57) ABSTRACT

An amplifier circuit comprising an input unit for maintaining a linearly amplified replica of the main input signal receives the main input signal and outputs a first output signal, which is the linearly amplified replica of the main input signal. The amplifier circuit further comprising a modulator controller that outputs a mutually exclusive first and second modulated signals from a respective first and second portion of the linearly amplified replica of the main input signal only when the input unit receives the main input signal. The first and the second modulator signals drive a voltage converter, with the voltage converter driving a respective first portion of a load and a second portion of the load. The amplifier circuit further includes a feedback unit for correction of a main output signal in relation to the main input signal.

14 Claims, 8 Drawing Sheets

BUCK CONVERTERS AS POWER AMPLIFIER

CROSS-REFERENCE TO RELATED APPLICATIONS

This Application claims the benefit of priority of the U.S. Utility Provisional Patent Application No. 60/900,839, filed Feb. 12, 2007, the entire disclosure of which application is expressly incorporated by reference in its entirety herein.

BACKGROUND OF THE INVENTION

1. Field of the Invention

This invention is related in general to power amplifiers and, in particular, to the use of buck converters within power amplifiers as a simple method of delivering power directly to a transducer load, a non-limiting example of which may include dual or single coil speakers.

2. Description of Related Art

Conventional amplifiers and buck converters are well known. Amplifiers are well known electronic devices that are used for increasing the power of a signal and are generally categorized into various classes, and buck converters are well-known voltage converters that convert an input voltage to a different output voltage. Reference is made to a few exemplary U.S. Patents that disclose various types of amplifiers and buck converters: U.S. Pat. Nos. 6,563,377; 6,498,531; 6,429,737; 6,356,151; 6,297,692; 6,282,747; 6,246,283; 6,229,388; 6,097,249; 6,091,292; 6,078,214; 6,072,361; 6,016,075; 5,959,442; 5,982,231; 5,973,368; 5,963,086; 5,838,193; 5,818,207; 5,805,020; 5,617,058; 5,160,8969; 5,014,016; 4,974,141; 4,531,096; and 3,629,616.

In general, class A amplifiers produce a linearly amplified replica of an input signal, but are inefficient in terms of power usage (generating a great amount of heat) because the amplifying elements are always biased and conducting, even if there is no input. With class A amplifiers, 100% of the input signal cycle is used to actually switch on the amplifying devices.

Figure 1A:
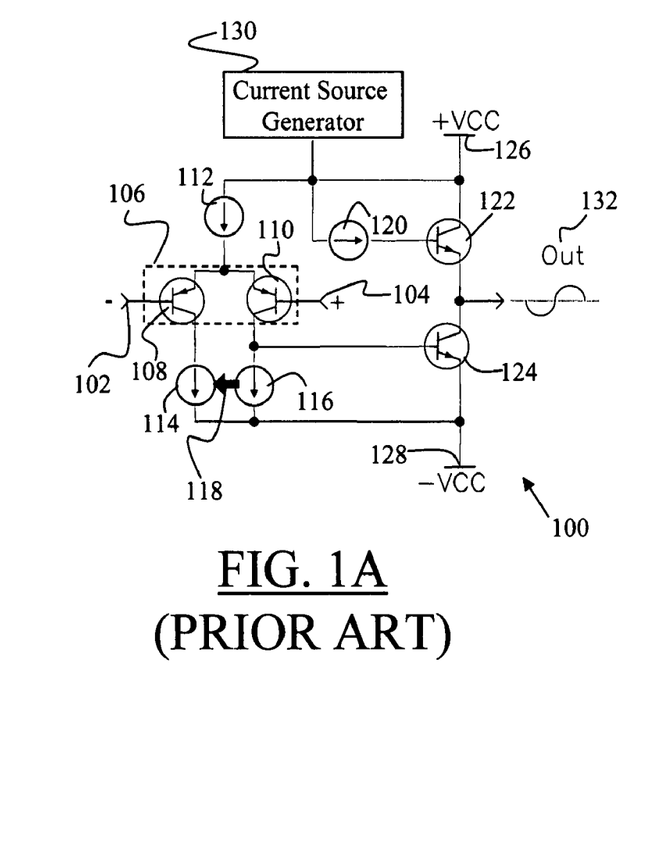
FIG. 1A is an exemplary schematic illustration of a prior art class A linear differential amplifier.

The prior art FIG. 1A is an exemplary illustration of a conventional class A amplifier 100 that amplify a differential input signal over the whole of the input cycle, having a differential input 106 with input signal terminals 102 and 104. With class A amplifier 100, the amplifying elements 122 and 124 (also constituting a buffer output stage) are biased by voltage sources 126 (+VCC) and 128 (-VCC) and the current sources 112 and 120. The biasing of the amplifier 100 is such that the amplifying elements are always conducting to some extent, and are operated over the most linear portion of their characteristic curve (known as transfer function or transconductance curve). In general, class A amplifiers are inefficient in terms of power usage because the amplifying element(s) are always biased and conducting, even if there is no input signal to be amplified.

As illustrated in the prior art FIG. 1A, a typical class A linear amplifier 100 with differential input 106 is comprised of a negative or inverted input terminal 102 coupled with a base of a first transistor 108, and a positive or non-inverted input terminal 104 coupled with a base of a second transistor 110. A current source generator 130, through a current source 112, biases the differential input 106. The emitters of the first transistor 108 and the second transistor 110 are coupled with the current source 112 for providing a precise, constant current level to the differential input transistors 108 and 110 for maintaining the differential signal between the two inputs. The collectors of the transistors 108 and 110 are coupled with respective secondary current sources 114 and 116, with the secondary current sources 114 and 116 coupled with one another through a feedback 118. The secondary current sources 114 and 116 with the feedback 118 accurately impose and maintain the differential input current passing through the transistors 108 and 110. As further illustrated, the current passing through the transistor 110 is supplied to the base of the second output-amplifying transistor 124, with a base of the first output-amplifying transistor 122 being supplied via a current source 120. With class A linear amplifiers with a differential input, the output signal 132 is a linear, amplified replica of the difference between the input signals. Therefore, constant current sources 112 and 120 are used to maintain a constant output that accurately reflects the amplified differential input. Biasing of the output amplifying elements 122 and 124 by the voltage sources 126 (+VCC) and 128 (-VCC) and the current sources 112 and 120 prevents crossover distortions because the amplifying elements are always ON, generating the linearly amplified replica of the original signal (differential signal). However, this is also the cause for the inefficiency of this type of amplifier.

The push-pull class B amplifiers amplify a signal through the balance of non-saturated sink and source (push-pull) output stage sections. This arrangement provides excellent efficiency (compared to class A amplifiers) because there is no biasing of the output amplifying elements by current sources. That is, unlike the class A amplifiers, the amplifying elements of class B amplifiers are not constantly ON. However, this introduces crossover distortion caused by a small glitch 160 (FIG. 1B) at the "link" between the two halves of the signal generated by the sink and the source. Regrettably, most solutions to reduce the crossover distortion (the small glitch 160 at the link between the two halves of the signal) reduce the efficiency of the class B amplifiers.

Figure 1B:
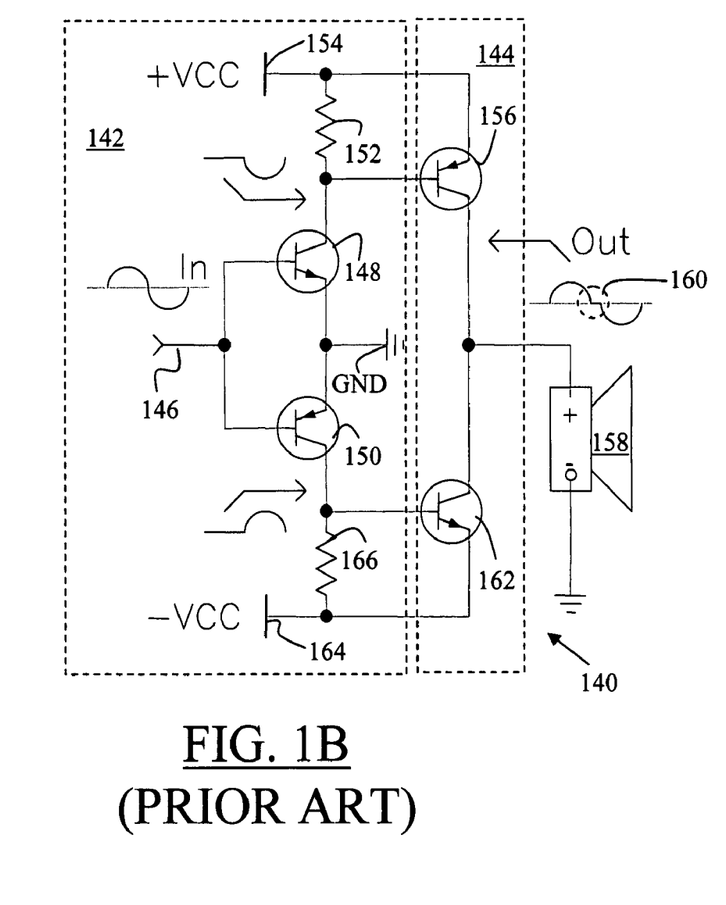
FIG. 1B is an exemplary schematic illustration of a prior art class B linear power amplifier.

The prior art FIG. 1B is an exemplary illustration of a class B linear power amplifier 140, which is comprised of an amplifying stage 142 and power stage 144. The amplifying stage 142 is comprised of an input terminal 146 that is coupled with a base of a first NPN Bipolar Junction Transistor (BJT) 148 and a base of a first PNP BJT 150. The emitters of the BJTs 148 and 150 are coupled together with ground GND. When a signal greater than the biasing signal of either transistor is applied to the transistors (assuming during a first half cycle of the input signal with a first polarity), the transistor 148 turns ON (+$V_{BE}$), and the transistor 150 remain OFF. Activation of the transistor 148 places a first polarity voltage across the resistor 152 coupled in between the positive voltage source +VCC 154 and the collector of the NPN BJT transistor 148. The current generated due to the voltage across the resistor 152 passes through the collector-emitter junction of the NPN BJT transistor 148 and to ground GND. The PNP transistor 150 is OFF due to the first polarity of the input signal, and hence, is "seen" as high impedance "open circuit." The voltage across the resistor 152 also biases the second PNP transistor 156 in the power stage 144, placing a first polarity voltage (+$V_{BE}$) across the base-emitter junction of transistor 156. The biasing of the second PNP transistor 156 allows current to pass through the emitter-collector junction, which current is an amplified replica of the first half of the input signal, and is fed to the load 158. During the first half cycle of the input signal, the first PNP transistor 150 and the second NPN transistor 162 are OFF. Both transistors 150 and 162 function as "open circuit" and are "seen" as high impedance elements during this first half cycle of the input signal.

It should be noted that there are no current sources with class B amplifiers, and hence, before the second half cycle of the input signal commences (during the zero-crossing of the input signal), all of the transistors are turned OFF due to the fact that the input signal strength is near zero, which is below the biasing threshold of the transistors. The small glitch 160 at the link between the two halves of the input signal is therefore due to the fact that all transistors are OFF during this crossover period. Upon crossover of the input signal to a second polarity, passing the biasing threshold of either of the transistors 148 and 150, in the second half of the cycle of the input signal, the transistor 150 is activated ($-V_{BE}$ functions as a sink) and transistor 148 remains OFF.

Activation of the transistor 150 places a second polarity voltage across the resistor 166 that is coupled in between the negative voltage source $-VCC$ 164 and the collector of the PNP BJT transistor 150. The current generated due to the voltage across the resistor 166 passes through the emitter-collector junction of the PNP BJT transistor 150 and to ground GND. The NPN transistor 148 is OFF due to the second polarity of the input signal, and hence, is "seen" as high impedance "open circuit." The voltage across the resistor 166 also biases the second PNP transistor 162 in the power stage 144, placing a second polarity voltage ($-V_{BE}$) across the base-emitter junction of transistor 162. The biasing of the second NPN transistor 162 allows current (sink current) to pass through the collector-emitter junction, which current is an amplified replica of the second half of the input signal, and is fed to the load 158. During the second half cycle of the input signal, the first NPN transistor 148 and the second PNP transistor 156 remain OFF. Both transistors 148 and 156 function as "open circuit" and are "seen" as high impedance elements during this second half cycle of the input signal. Accordingly, not constantly biasing ON all of transistors of a class B amplifiers during the full (or whole) cycle of the input signal produces the glitch 160 when the input signal falls below the biasing threshold of the transistors during its zero crossing.

Class D amplifiers are switching power amplifiers where all power devices are operated in ON/OFF mode. The switching elements of class D amplifier are either cut off or in saturation most of the time, allowing for high efficiencies. The high efficiency translates into reduced heat sinking, smaller size, and lighter weight. Further, in general, class D amplifiers do not suffer from crossover distortion within the audio bandwidth.

Figure 1C:
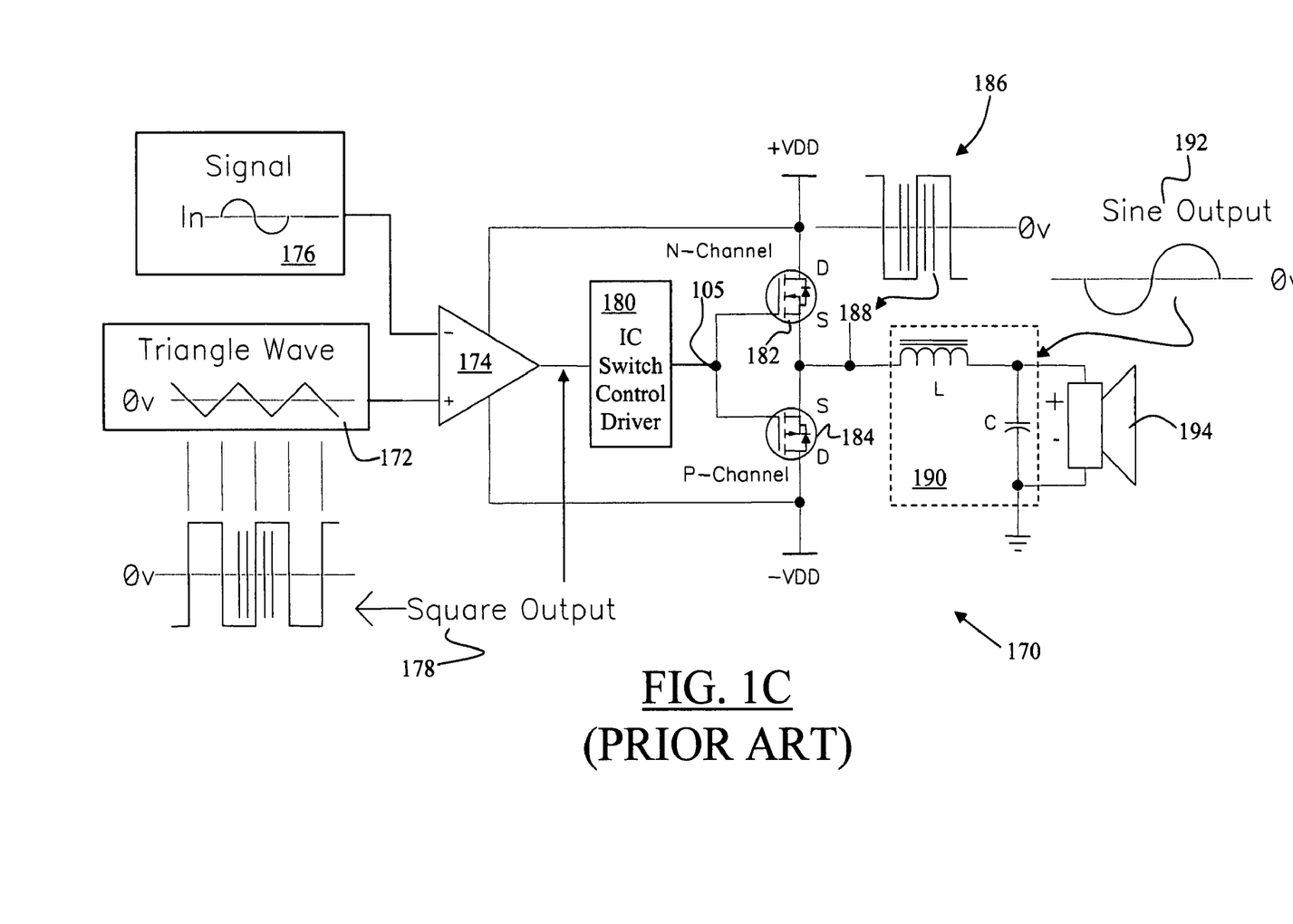
FIG. 1C is an exemplary schematic illustration of a prior art class D switching power amplifier.

The prior art FIG. 1C is an exemplary illustration of a typical Half-Bridge class D switching power amplifier 170, with a triangle wave generator 172 creating a triangle waveform carrier frequency. In general, class D amplifiers convert the audio signal 176 into high-frequency pulses that switch the output in accordance with the audio input signal 176. Some class D amplifier use pulse width modulators to generate a series of conditioning pulses that vary in width with the audio signal's amplitude. The varying-width pulses switch the power-output transistors 182 and 184 at a fixed frequency. In general, the output of the class D amplifier is fed into a low-pass filter 190 that converts the pulses back into an amplified audio signal 192 that drives an audio system 194. This design approach produces an amplifier with better than 90% efficiency, but is much more complex than its linear counterpart (class A or class B amplifiers). Further, due to the wave generator 172, regardless of any input signal value 176, the IC switch control driver 180 and the power-output transistors 182 and 184 are always switched ON and OFF at 188, which create inefficiency and generate Electro Magnetic Interferences (EMI). That is, regardless of any input signal 176 (even if there is no signal, with the input signal 176 value equal to zero), the IC switch control driver 180 and the power-output transistors 182 and 184 are continuously provided with current signal form the triangle wave generator 172.

As illustrated, the basic circuit layout of the class D amplifier is substantially similar to that of linear amplifiers, such as classes A and B, with a major difference being in the signals provided to an output stage. Rather than feeding an audio waveform directly to the output stage, as is done in linear amplifiers, the class D amplifier first feeds the audio waveform into a Pulse Width Modulator (PWM) circuit that feeds modulated pulses to the output stage. By quickly switching the output stage completely ON and completely OFF with varying pulse widths, the class D amplifier is able to recreate waveforms of almost any shape, and, by filtering the switching output, sound is produced by a loudspeaker connected thereto.

The conventional voltage comparator 174 compares the triangle waveform with the command input signal (audio input) at 176. The PWM signal 178 from the comparator 174 is then sent to a field effect transistor (FET) driver integrated circuit 180 that drives the output FET's 182, 184. The upper N-channel output FET 182 switches a bus voltage supplied from +VDD and the lower P-channel output FET 184 switches a bus voltage supplied from $-VDD$ to produce a high-voltage PWM waveform 186 illustrated at test point 188. This means that the output will not be a linearly amplified replica of the input, and therefore, must be processed further. The further processing is comprised of an LC filter 190, which reproduces the audio signal (amplified) 192 at the load 194.

As indicated above, class D amplifiers yield higher efficiency than other class amplifiers through use of saturated mutually exclusive source and sink switching devices. However, it should be noted that even if there is no input signal 176, there continues to be power dissipation and generation of EMI within the amplifier circuit due to the current that is generated at 188. Further, despite their efficiency, most class D amplifiers are comprised of complex proprietary Integrated Circuits (ICs) for control of the switches, cannot accurately reproduce the input waveform except for low fidelity applications, and are subject to power supply perturbations.

Accordingly, in light of the current state of the art and the drawbacks to current amplifiers mentioned above, a need exists for an amplifier that would have simple, non-proprietary circuit topography that would allow for the use of off-the-shelf components, that would continue to be highly efficient, that would not require power supply regulations, that would produce a linear amplified replica of an input signal, and having switching components that would be completely OFF in the absence of an input signal.

BRIEF SUMMARY OF THE INVENTION

The present invention discloses the utilization of dual buck converters in a power amplifier circuit to drive a transducer load.

One aspect of the present invention provides an amplifier circuit, comprising an input unit for receiving a main input signal, and for maintaining, and outputting a linearly amplified replica of the main input signal. Further included is a modulator controller that outputs mutually exclusive first and second modulated signals from a respective first and second portion of the linearly amplified replica of the main input signal only when the input unit receives the main input signal. The first and the second modulator signals drive a voltage converter, with the voltage converter driving a respective first portion of a load and a second portion of the load. Also included is a feedback unit for correction of a main output signal in relation to the main input signal.

An optional aspect of the present invention provides an amplifier wherein the input unit is comprised of a comparator comparing the main input signal with the main output signal. The comparator includes first input coupled to a gain circuit, a second input coupled to ground, and a comparator output coupled to the modulator controller.

Another optional aspect of the present invention provides an amplifier wherein the gain circuit is comprised of a set of impedances.

Yet another optional aspect of the present invention provides an amplifier wherein the comparator is comprised of a linear amplifier used as an error amplifier.

A further optional aspect of the present invention provides an amplifier comprised of a first modulator unit that outputs the first modulated signal from the first portion of the linearly amplified replica of the main input signal only when the input unit receives the main input signal. Further included is a second modulator unit that outputs the second modulated signal from the second portion of the linearly amplified replica of the main input signal only when the input unit receives the main input signal, with the first and second modulated signal outputs being mutually exclusive.

Another optional aspect of the present invention provides an amplifier comprised of the first modulator unit having a first modulator with a first input terminal with a first polarity coupled with a first ramp generator, a second input terminal with a second polarity, opposite the first polarity, coupled with the linearly amplified replica of the main input signal, and a first output terminal. The second modulator unit is comprised of a second modulator having a third input terminal with the first polarity coupled with the linearly amplified replica of the main input signal, and a fourth input terminal with the second polarity coupled with a second ramp generator, and a second output terminal.

Yet another optional aspect of the present invention provides an amplifier, wherein the first ramp generator outputs signal values of second polarity that set a modulation frequency of the amplifier. The second ramp generator outputs signal values of first polarity that set the modulation frequency of the amplifier.

A further optional aspect of the present invention provides an amplifier wherein the first and the second ramp generators output signals that are of one of a saw tooth waveform and a triangular waveform.

Still a further optional aspect of the present invention provides an amplifier wherein the first output terminal of the first modulator is coupled with an input of a first buffer that outputs a modulated signal with the second polarity for turning ON and OFF a first switch. The second output terminal of the second modulator is coupled with an input of a second buffer that outputs the modulated signal with the first polarity for turning ON and OFF a second switch, with the first and the second switches mutually exclusively turned to ON and OFF.

Another optional aspect of the present invention provides an amplifier wherein the voltage controller is comprised of a buck converter.

Yet another optional aspect of the present invention provides an amplifier wherein the buck converter is a dual buck converter.

A further optional aspect of the present invention provides an amplifier wherein the first modulator unit is coupled with a first voltage converter with the first modulated signal output driving the first voltage converter. The second modulator unit is coupled with a second voltage converter with the second modulated signal output driving the second voltage converter.

Another optional aspect of the present invention provides an amplifier further comprising a protection circuit, which shuts down the amplifier based on undesirable condition.

Yet another optional aspect of the present invention provides an amplifier wherein the feedback unit is comprised of a feedback differential amplifier that is coupled with the first and second portion of the load. Further included, a phase lag compensation circuit for preventing oscillation that is coupled at one end with an output of the feedback differential amplifier, and at another end with the first input unit.

A further optional aspect of the present invention provides an amplifier wherein the feedback differential amplifier is comprised of a first input terminal with a first polarity coupled with the first portion of the load through a first impedance, and a second input terminal with a second polarity, which is opposite the first polarity, with the second input terminal coupled with the second portion of the load through a set of second impedances with a voltage divider topography. The feedback differential amplifier has a feedback impedance that couples the output thereof with the first impedance.

Another optional aspect of the present invention provides an amplifier wherein the first and the second portion of the load are comprised of at least one single coil, with the modulator controller varying a polarity of the at least one single coil.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character (s) present corresponding part(s) throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

Figure 2A:
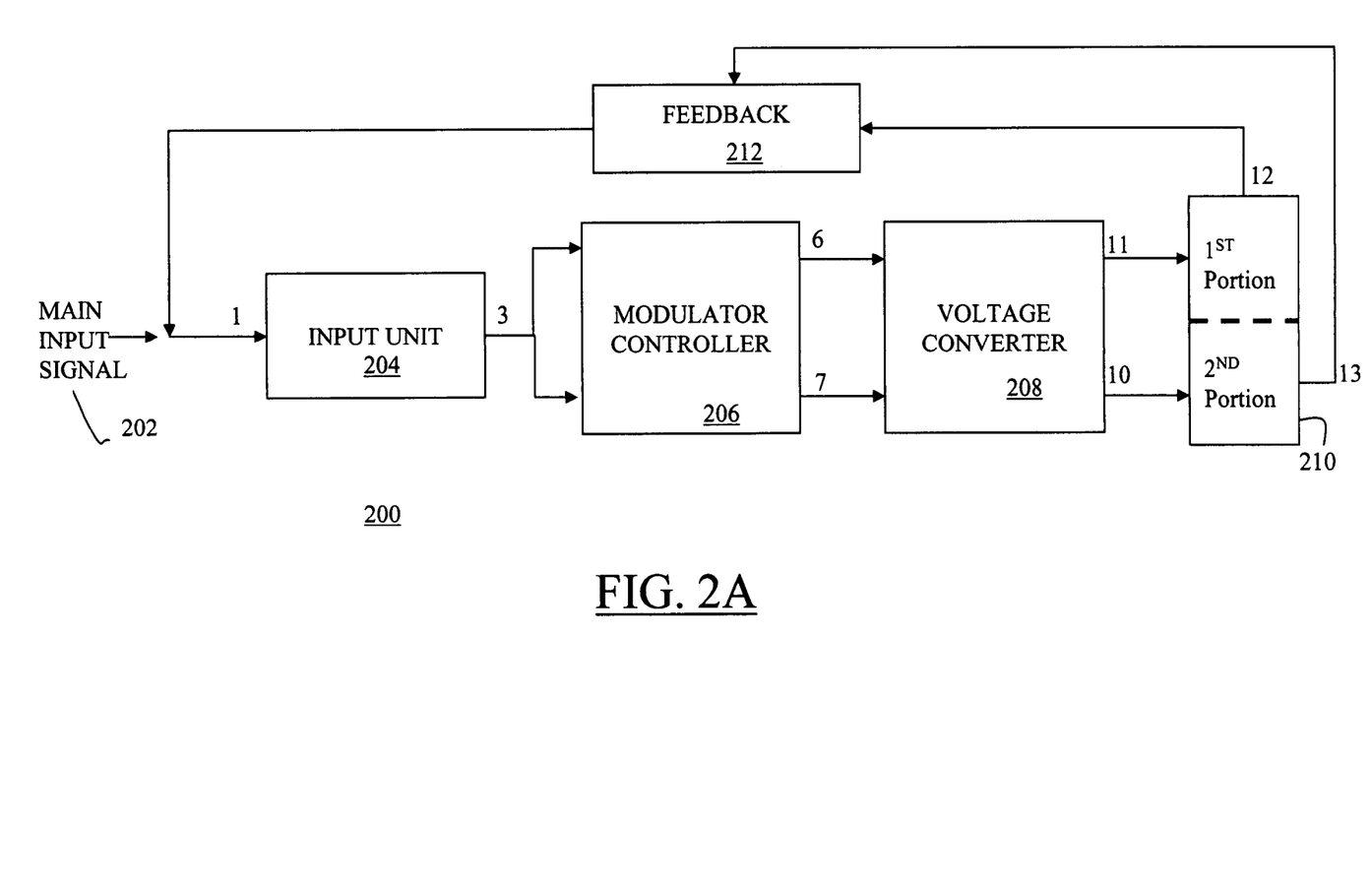
FIG. 2A is an exemplary simplified systems overview schematic block diagram illustration of an amplifier in accordance with the present invention.

FIG. 2A is an exemplary simplified systems overview schematic block diagram illustration of an amplifier in accordance with the present invention. As illustrated, the present invention discloses an amplifier 200 that produces a linearly amplified replica of a main input signal, provides the advantages and the functionality of a class D amplifier, but without the problems in relation to complex circuit topography and proprietary aspect related to the class D amplifiers, and does not require a regulated power supply, and is completely OFF when there is no main input signal. The amplifier circuit of the present invention is comprised of an input unit 204 for maintaining a linearly amplified replica of an incoming main input signal 202 at point 1. The input unit 204 receives the main input signal 202 and outputs a first output signal at point 3, with the first output signal at point 3 being the linearly amplified replica of the main input signal 202.

As further illustrated in FIG. 2A, the amplifier 200 of the present invention is further comprised of a modulator controller 206 that receives and modulates the first output signal to a high frequency modulated switching signal. The modulator controller 206 modulates the first output signal at point 3, and outputs a mutually exclusive first and second modulated signal at respective points 6 and 7 based on a respective first and second portion of the first output signal. It should be noted that the modulation takes place only when the input unit 204 actually receives the main input signal at point 1. The first and the second modulator signals at respective points 6 and 7 are used to drive a voltage converter 208, which, in turn, drive a respective first portion of a load 210 and a second portion of the load 210 at points 11 and 10. As further illustrated, the amplifier 200 of the present invention further includes a feedback unit 212, which receives signals at points 12 and 13 from the respective first and second portions of the load 210 for correction of a main output signal in relation to the main input signal 202, and output a resulting feedback signal.

Figure 2B:
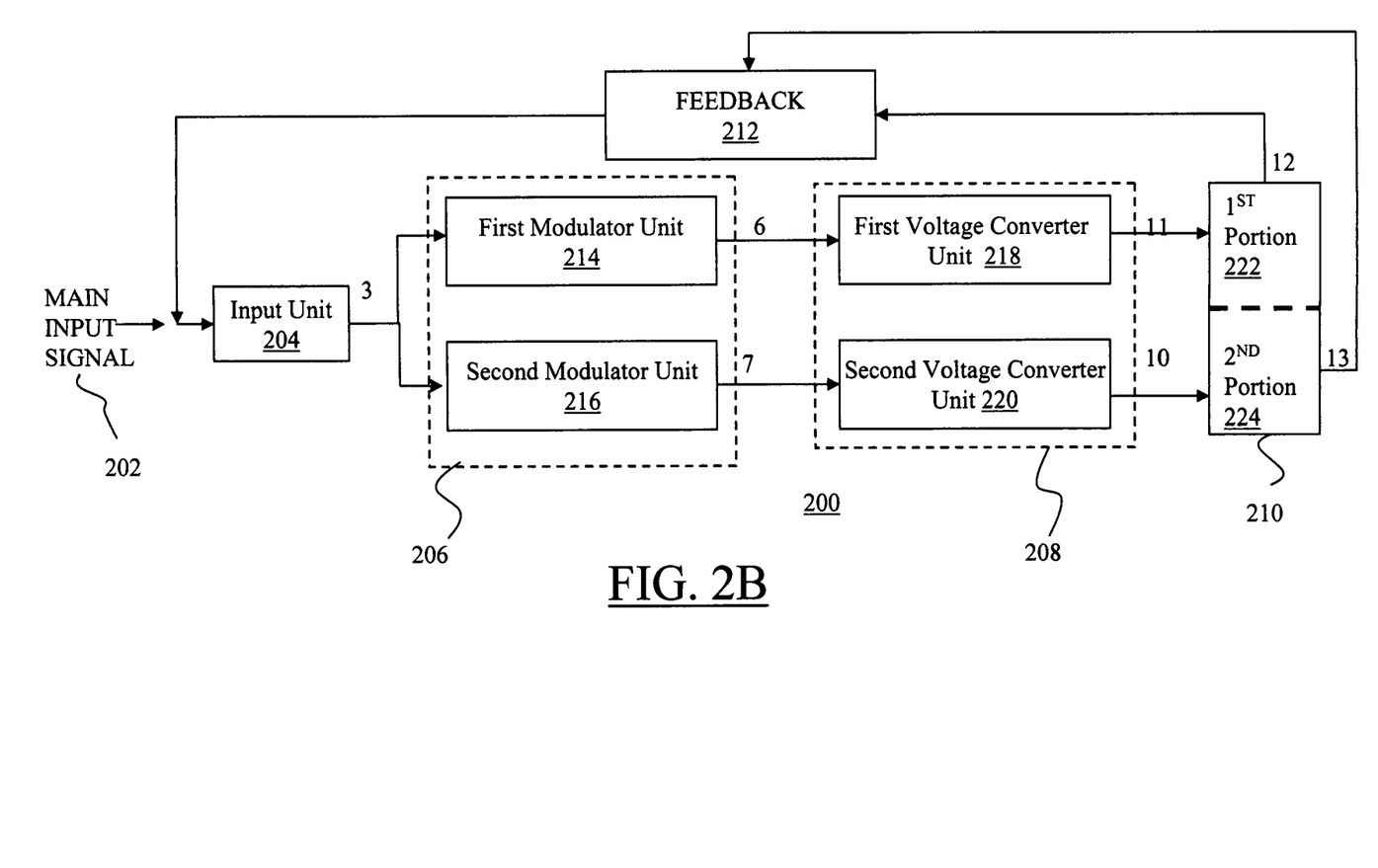
FIG. 2B is an exemplary systems overview schematic block diagram illustration of the amplifier illustrated in FIG. 2A in accordance with the present invention.

FIG. 2B is an exemplary systems overview schematic block diagram illustration of the amplifier 200 illustrated in FIG. 2A in accordance with the present invention. As illustrated, the modulator controller 206 is comprised of a first modulator unit 214 that outputs the first modulated signal at point 6 from the first portion of the linearly amplified replica of the main input signal 202 only when the input unit 204 receives the main input signal 202. Further, the modulator controller 206 includes a second modulator unit 216 that outputs the second modulated signal at point 7 from the second portion of the linearly amplified replica of the main input signal 202, again, only when the input unit 204 receives the main input signal 202, with the first and second modulated signal outputs at points 6 and 7 being mutually exclusive.

As further illustrated in FIG. 2B, the voltage converter 208 is comprised of first voltage converter unit 218 coupled with the first modulator unit 214, with the first modulated signal output at point 6 driving the first voltage converter unit 218. Further, the voltage converter 208 includes a second voltage converter unit 220 coupled with the second modulator unit 216, with the second modulated signal output at point 7 driving the second voltage converter unit 220. The voltage converter units 218 and 220, in turn, drive the respective first portion of the load 210 and the second portion of the load 210 at points 11 and 10. Accordingly, the amplifier 200 of the present invention generates and outputs a linearly amplified replica of the incoming main input signal 202 at point 3, "split-processes" this signal into its respective first and second polarity, and processes each to drive the first and second portion of the load 210. The topography of the amplifier of the present invention "splitting" the processing of the signals into their respective first and second polarities enables the entire circuit to remain OFF when there is no main input signal 202.

Figure 3:
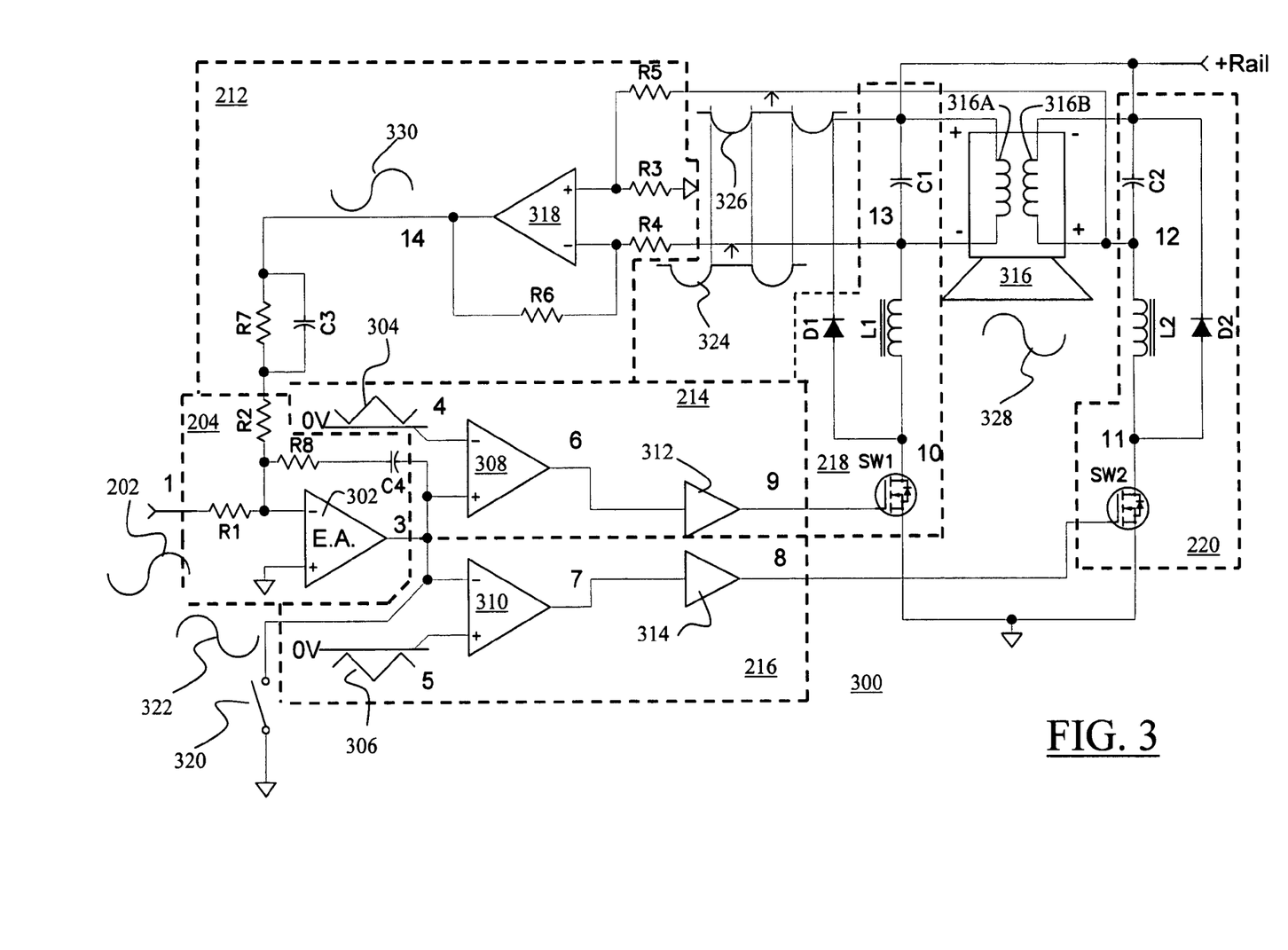
FIG. 3 is an exemplary detailed schematic illustration of an amplifier in accordance with the present invention.
Figure 5:
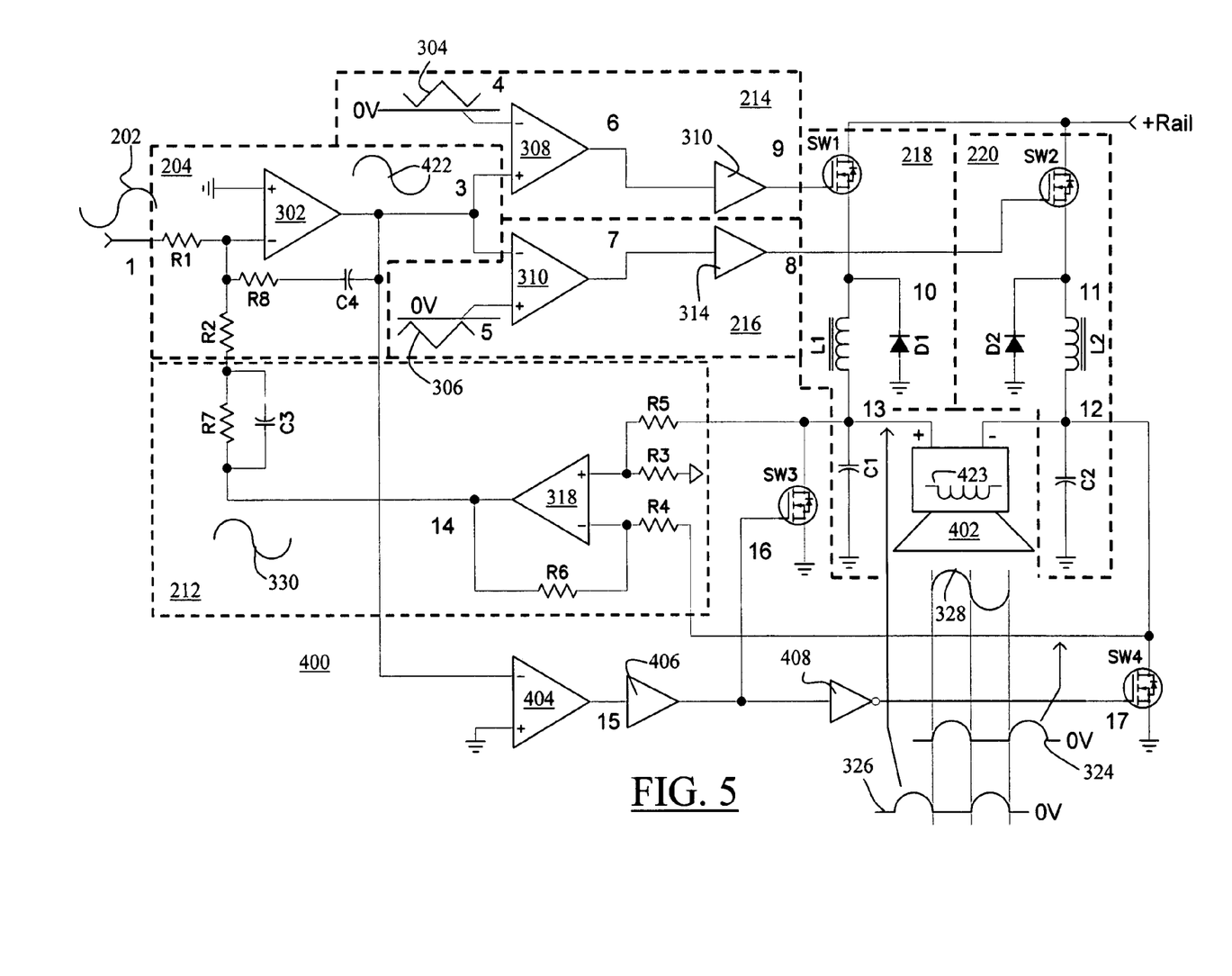
FIG. 5 is an exemplary illustration of a second embodiment of an amplifier that includes a load with a single coil in accordance with the present invention.

FIGS. 3 and 5 are exemplary detailed schematic illustrations of the amplifier 200 of FIGS. 2A and 2B. FIG. 3 is an exemplary illustration of one embodiment of the amplifier 200 where the load 210 includes the use of dual coils, with a first and second switch SW1 and SW2 of the respective first and second voltage converter units 218 and 220 coupled with ground. FIG. 5 is an exemplary illustration of the other embodiment of the amplifier 200 where the load 210 includes the use of a more common single coil, with a first and second switch SW1 and SW2 of the respective first and second voltage converter units 218 and 220 coupled with a power Rail, and includes additional switching for controlling the signal coil to function as a dual coil.

Figure 4:
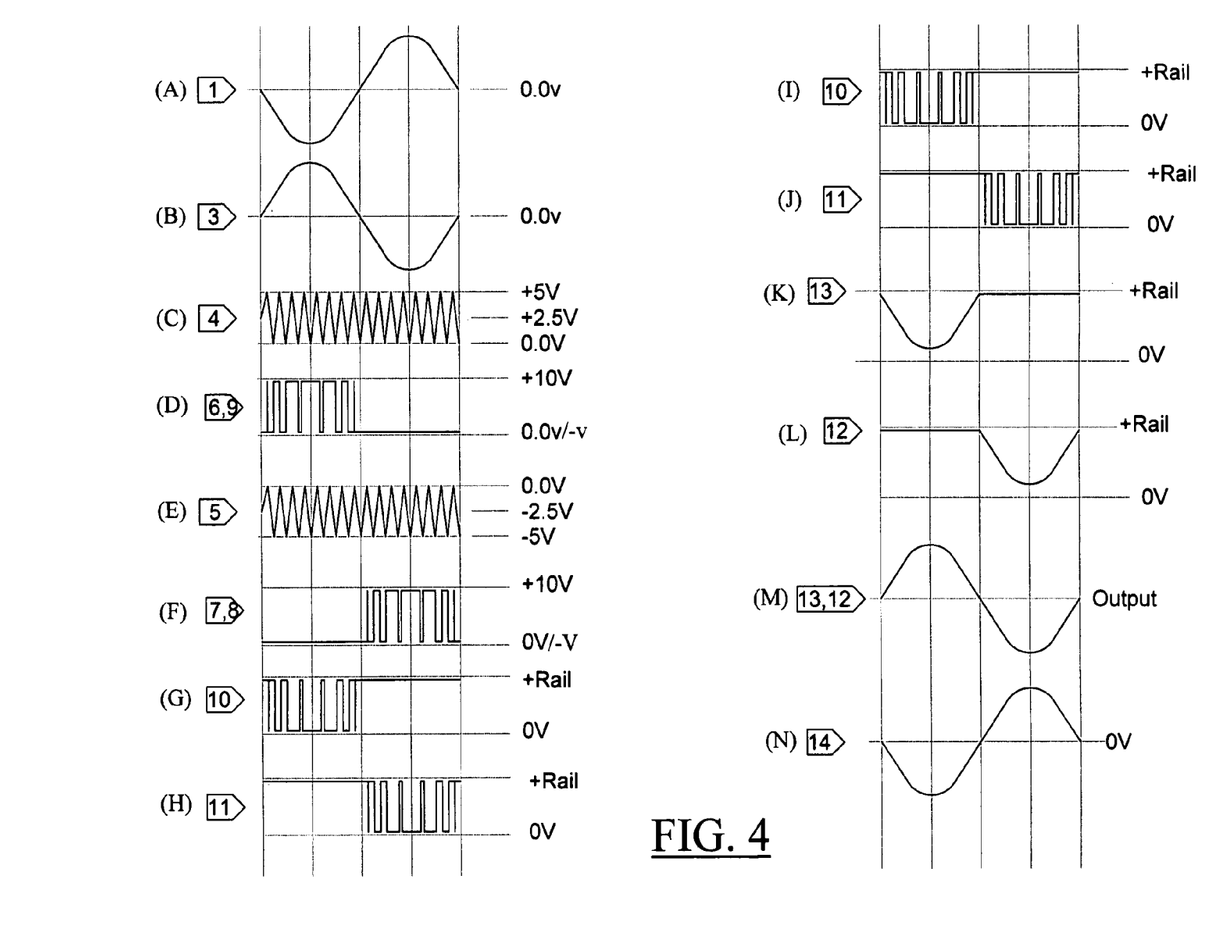
FIGS. 4(A) to 4(N) are exemplary waveform diagrams illustrating the various waveforms at particular points in the circuit of FIG. 3.

As stated above, FIG. 3 is an exemplary detailed schematic illustration of the amplifier 300 in accordance with the present invention, and FIGS. 4(A) to 4(N) are exemplary waveform diagrams illustrating the various waveforms at particular points in the circuit of FIG. 3. As illustrated in FIG. 3, a main input signal 202 at point 1 (an exemplary non-limiting waveform of which is illustrated in FIG. 4(A)) in combination with a feedback signal 330 is coupled with a negative or inverted input terminal of a comparator 302 through a resistor R1, with the comparator 302 functioning as an error amplifier. The comparator 302 may be implemented as a class A linear amplifier with differential input, the details of which are illustrated in the prior art FIG. 1A, and described above, and is used as an error amplifier. The comparator 302 (hereinafter error amplifier 302) controls the overall gain of the amplifier 300, its DC-offset output, frequency response, and compensates for possible errors such as crossover distortions introduced by transistors SW1 and SW2 of the respective voltage converter units 218 and 220. The error amplifier 302 is comprised of a first negative input terminal coupled to a gain circuit, a second positive input terminal coupled to ground, and a first output coupled to the modulator controller 206. The gain circuit is comprised of resistors R1 and R2. The actual gain of the output signal of the gain circuit is proportional to the amount by which the resistor R2 is greater than R1. This output is combined with the main input signal 202 at the negative input terminal of the error amplifier 302, which amplifies and inverts the incoming main input signal 202. The first output of the error amplifier 302 at point 3 is therefore an inverted, linearly amplified replica of the main input signal 202 at point 1. An exemplary non-limiting waveform of the signal at point 3 is illustrated in FIG. 4(B). Accordingly, as illustrated in FIGS. 4(A) and 4(B), points 1 and 3 have signal cycles that are of opposite polarity.

The output of the error amplifier 302 at point 3 is coupled with a modulator controller 206. It would be appreciated by those skilled in the art that the inverting of the main input signal 202 is optional. That is, the circuit topography of the amplifier 300 may easily be reconfigured so to use the non-inverted terminal of the error amplifier 302 instead, which would generate a non-inverted signal at point 3. Further included with the error amplifier 302 is a series coupled capacitor C4, resistor R8, and resistor R1, which function to maintain stability between the main input signal 202 and the main output signal 328. The error amplifier feedback comprised of capacitor C4 and resistor R8 maintains stability of the circuit 300 by neutralizing or canceling inherent parasitic oscillations that may occur. The capacitor C4 and resistor R8 combination also maintain the overall gain between the main input signal 202 and the main output signals 328, and maintain low distortions at the main output signal 328.

As further illustrated in FIG. 3, the amplifier 300 of the present invention further includes a modulator controller 206 that outputs a mutually exclusive first and second modulated signal from a respective first and second portion of the linearly amplified replica of the main input signal 202 only when the input unit 204 receives the main input signal 202. The modulator controller 206 is comprised of a first modulator unit 214 that outputs the first modulated signal at point 6 (an exemplary non-limiting waveform of which is illustrated in FIG. 4(D)) from the first portion of the linearly amplified replica of the main input signal 202, only when the input unit 204 receives the main input signal 202. As further illustrated, the modulator controller 206 also includes a second modulator unit 216. The second modulator unit 216 outputs a second modulated signal at point 7 (an exemplary non-limiting waveform of which is illustrated in FIG. 4(F)) from the second portion of the linearly amplified replica of the main input signal 202, only when the input unit 204 receives the main input signal 202. The first and second modulated signal outputs at point 6 and 7 are mutually exclusive. The first and second modulator units 214 and 216 can be based on pulse, frequency, or any others such as amplitude modulation. That is, the modulation does not have to be based on pulse. As illustrated in FIGS. 4D and 4F, the signals generated at points 6 and 7 are square.

The first modulator unit 214 is comprised of a first modulator 308 having a first input terminal with a first (negative) polarity coupled with a first ramp generator 304. The first modulator 308 further includes a second input terminal with a second (positive) polarity, opposite the first polarity, coupled with the inverted, linearly amplified replica of the main input signal 202 at point 3, and a first output terminal generating a first modulated output signal at point 6. The first modulated output signal at point 6 is input to a first buffer 312 that outputs a first current amplified modulated signal at point 9 (an exemplary non-limiting waveform of which is illustrated in FIG. 4(D)) for turning ON and OFF a first switch SW1.

The second modulator unit 216 is comprised of a second modulator 310 having a third input terminal with the first (negative) polarity coupled with the inverted, linearly amplified replica of the main input signal 202 at point 3. The second modulator 310 further includes a fourth input terminal with the second (positive) polarity coupled with a second ramp generator 306, and a second output terminal generating a second modulated output signal at point 7. The second modulated output signal at point 7 is input to a second buffer 314 that outputs a second current amplified modulated signal at point 8 (an exemplary non-limiting waveform of which is illustrated in FIG. 4(F)) for turning ON and OFF a second switch SW2, with the first and the second switches SW1 and SW2 mutually exclusively turned to ON and OFF.

As illustrated in FIG. 3, the first ramp generator 304 outputs signal values of second (positive) polarity at point 4 (an exemplary non-limiting waveform of which is illustrated in FIG. 4(C)) that set a modulation frequency of the amplifier 300. It should be noted that the output signal values of the first ramp generator 304 do not cross the zero volts, and are always above the zero-crossing (as a non-limiting example only, the lowest value may, for example, be approximately above 0.5V). The second ramp generator 306 also outputs signal values, but of first (negative) polarity at point 5 (an exemplary non-limiting waveform of which is illustrated in FIG. 4(E)) that also set the modulation frequency of the amplifier 300. It should be noted that the output signal values of the second ramp generator 306 do not cross the zero volts, and are always below the zero-crossing (as a non-limiting example only, the highest value may, for example, be approximately below −0.5V). In general, the first and the second ramp generators 304 and 306 are well-known and output signals that are of one of a saw tooth waveform and a triangular waveform. The ramp generators set the minimum frequency of operation of the amplifier 300 of the present invention. In general, the frequency of operation for the amplifier 300 is approximately 10 times the frequency of the main input signal 202 (if the amplifier 300 is used for audio operations). Therefore, given the frequency of the main input signal 202, the frequency of operation of the amplifier 300 is set by setting the frequency of the signals of the ramp generators 304 and 306, which is similar to setting a clock signal of a computer.

The modulator controller 206 "split-processes" the inverted, linearly amplified replica of the main input signal 202 output at point 3 into its respective set of first (negative) and second (positive) polarities for processing the signal. That is, the first modulator 308 with its second input terminal (second polarity-positive) is effected by the portion of the output signal of the error amplifier 302 at point 3 that is of second (positive) polarity. The second modulator 310 with its third input terminal (negative) is effected by the portion of the output signal of the error amplifier 302 at point 3 that is of first (negative) polarity, which is inverted into positive by the third input terminal.

The first ramp generator 304 outputs signal values of second (positive) polarity at point 4, and couples the output signal with the first input terminal (first polarity-negative) of the first modulator 308. The first modulator 308 combines the signal generated by the first ramp generator 304 at point 4 (which is of positive polarity) with the second (positive) polarity portion of the inverted, linearly amplified replica of the main input signal 202 output at point 3, and generates and outputs a modulated signal at point 6. The first modulated output signal at point 6 is input to the first buffer 312 that outputs a first current amplified modulated signal at point 9 for turning ON and OFF a first switch SW1. It should be noted that the first buffer 312 and the second buffer 314 are well-known gate drivers that drive the respective switches SW1 and SW2.

In general, gate drivers are used to increase the current within a signal. The signal current at points 6 and 7 is not sufficient to turn ON the respective switches SW1 and SW2. The gate drivers 312 and 314 may be looked at as current amplifiers that increase the amount of current within a signal to drive the switches SW1 and SW2. The lack of current to drive the respective switches SW1 and SW2 is due in part to the high impedance of the input unit 204 and the modulator controller 206. These devices are comprised of semiconductors and cannot handle high currents or generate them, and therefore, inherently are build to have a high internal impedance. Accordingly, the signals at points 6 and 7 may have a high voltage, but possess insufficient current to drive the respective switches SW1 and SW2. Of course, it should be noted that if buffer gate drivers 312 and 314 are eliminated, then modulators 308 and 310 must be modified to generate sufficient current to drive the respective switches SW1 and SW2. It should further be noted that all switching frequency for amplifier 300 is categorized or considered as high frequency because the amplifier 300 of the present invention may be used for generating audio signals; hence, the circuit operates at very high frequency. In general, for example, the frequency of operation for the circuit 300 may be approximately 10 times the frequency of the main input signal 202.

The second ramp generator 306 outputs signal values of first (negative) polarity at point 5, and couples the output signal with the fourth input terminal (first polarity-positive) of the second modulator 310. The second modulator 310 combines the signal generated by the second ramp generator 306 at point 5 (which is of negative polarity) with the first (negative) polarity portion of the inverted, linearly amplified replica of the main input signal 202 output at point 3, and generates and outputs a modulated signal at point 7. The second modulated output signal at point 7 is input to the second buffer gate driver 314 that outputs a first current amplified modulated signal at point 8 for turning ON and OFF a second switch SW2.

It is important to note that if there is no main input signal 202, then the input unit 204, the modulator controller 206, and the switches SW1 and SW2 are OFF, making the amplifier 300 of the present invention very efficient. As indicated above, the prior art IC switch control driver 180 (of FIG. 1C) and the power-output transistors 182 and 184 are turned ON due to current from the triangle wave generator 172, even if there is no input signal 176, which tends to reduce the efficiency of this type of amplifiers. That is, regardless of any input signal 176 (even if there is no signal, with the input signal 176 value equal to zero), the IC switch control driver 180 and the power-output transistors 182 and 184 are continuously provided with current signal form the triangle wave generator 172.

With the present invention however, if the main input signal 202 is zero, then the input unit 204, the modulator controller 206, and the switches SW1 and SW2 are OFF. In other words, when there is no main input signal 202, there is no high frequency switching, which means that the voltage converter units 218 and 220 stay completely OFF. Accordingly, a zero value for the main input signal 202, which translates as an inverted, linearly amplified replica of the main input signal 202 output at point 3 with a zero signal value, will not generate any signal. In other words, with prior art amplifiers, there is always switching at 50% of the duty cycle of the ramp generator. That is, even with no signal input 176, there is sufficient amplitude from the ramp generator 172 (the portion of the signal 172 above the zero-crossing, the positive) that would turn ON the switches of the class D amplifier, regardless of zero input signal 176. The switches are turned ON with positive polarity signal, and OFF when the signal is zero or crosses over to the negative cycle. With the present invention however, there is no switching signal at the outputs of modulators 6 and 7 when there is no input signal at node 3. As indicated above, the first ramp generator 304 outputs signal values of second (positive) polarity at point 4, and couples the outputted signal with the first input terminal (negative) of the first modulator 308. In other words, this positive polarity signal from the first ramp generator 304 is inverted into a negative signal value by the first negative input terminal. The first modulator 308 combines the signal generated by the first ramp generator 304 at point 4 with the second (positive) polarity portion of the inverted, linearly amplified replica of the main input signal 202 output at point 3, and generates and outputs a modulated signal at point 6. However, when the linearly amplified replica of the main input signal 202 output at point 3 is zero, the resulting comparison (or modulation) is either a zero or negative output at point 6. Recall that the output signal values of the first ramp generator 304 are inverted to negative signal values by the negative input terminal of the first modulator 308, therefore, the switch SW1 will remain OFF due to the negative (inverted by the first negative input terminal of the modulator 308) signal values of the ramp generator 304 in combination with the zero signal values at point 3. The switches SW1 and SW2 are turned ON only with signal values of positive polarity.

Further, as also indicated above, the second ramp generator 306 outputs signal values of first (negative) polarity at point 5, and couples the outputted signal with the fourth input terminal (second polarity-positive) of the first modulator 310. In other words, this negative polarity signal from the second ramp generator 306 is not inverted. The second modulator 310 combines the signal generated by the second ramp generator 306 at point 5 with the first (negative) polarity portion of the inverted, linearly amplified replica of the main input signal 202 output at point 3. This first negative polarity portion of the linearly amplified replica of the main input signal 202 is inverted by the third input terminal (negative) of the modulator 310 into a positive polarity signal. This signal is then modulated in accordance with the modulation frequency set by the ramp generator to generate and output a modulated signal at point 7. However, when the linearly amplified replica of the main input signal 202 output at point 3 is zero, the resulting comparison (or modulation) is either a zero or negative output at point 7. Recall that the output signal values of the second ramp generator 304 are negative signal values, and are not inverted, therefore, the switch SW2 will remain OFF due to the negative signal values of the ramp generator 306 in combination with the zero signal values at point 3.

According, the amplifier 300 of the present invention includes square signal generators that is designed to mutually exclusively turn ON the respective switches SW1 and SW2 when there is a main input signal 202 and maintain them at an OFF state when there is no main input signal 202, regardless of the ramp generator signals.

As further illustrated, the voltage converter units 218 and 220 are buck converters, with the first voltage converter unit 218 (hereinafter buck converter 218) coupled with the output of the first current amplified modulated signal at point 9, and the second voltage converter unit 220 (hereinafter buck converter 220) coupled with the output of the second current amplified modulated signal at point 8. As stated above, the invention relates to amplifiers that use buck converters to drive a transducer load 316 in a power amplifier circuit. As illustrated, the amplifier 300 is comprised of dual buck converters 218 and 220 that are coupled to a transducer load 316, with each buck converter driving a separate portion (316A and 316B) of the transducer loads 316, with each set comprising at least one load. In other words, there could be one or more transducer coil 316A connected in parallel to one another to form the first set of transducer load 316A, and one or more coil 316B connected in parallel to one another to form the second set of transducer loads 316B. If the loads are speakers as illustrated, one of the buck converters will pull the speaker diaphragm back while the other will push the speaker diaphragm forward when the switches SW1 and SW2 operate, to vibrate and create sound. Of course, the load 316 could be a linear motor where one buck converter drives the motor to pull-down a device and the other drives the motor to push-up the device, creating a vibrating shock device. Hence, any type of transducer load can be used, and is not limited to the exemplary illustrated speaker coils.

In general, the circuit topography and functionality of buck converters are very well known. The inductor/capacitor of the buck converters function as low pass filters that remove the carrier signal, which is the high frequency modulation portion of the signal generated by the modulator controller 206 to turn ON/OFF the switches SW1 and SW2, with only the low frequency portion (demodulated) of the signal remaining, which is input to the loads. In other words, the inductor/capacitor combination of a buck converter functions as demodulator for demodulating a modulated signal. It should be noted that any type of switches or switching devices SW1 and SW2 may be used for the buck converters, including BJT, IGBT, mechanical relays, etc.

When the switch SW1 or SW2 is turned ON, the respective buck converter will function in a well known manner to drive the respective portions (coil 316A or coil 316B) of the transducer load 316. That is, the switch SW I will generate a signal at point 10 (an exemplary non-limiting waveform of which is illustrated in FIGS. 4(G) and 4(H)). The signal at 10 will charge the inductor L1, which initially has large impedance. The charge from the inductor L1 will charge the capacitor C1 that, in turn, will create a voltage across the coil load 316A at point 13 (an exemplary non-limiting waveform of which is illustrated in FIG. 4(K)). When the switch SW1 is OFF, the polarity on L1 reverses and the diode D1 functions as a closed switch, and the capacitor C1 is charged by the charge within the inductor L1, which, in turn, continues to create or maintain the voltage across the coil load 316A at point 13. When the switch SW1 is OFF, the switch SW2 is ON (assuming there is a main input signal 202), with the buck converter 220 operating to place a voltage across the coil 316B in similar manner to that of buck converter 218, described above. That is, the switch SW2 will generate a signal at point 11 (an exemplary non-limiting waveform of which is illustrated in FIGS. 4(H) and 4(J)). The signal at 11 will charge the inductor L2, which initially has large impedance. The charge from the inductor L2 will charge the capacitor C2 that, in turn, will create a voltage across the coil load 316B at point 12 (an exemplary non-limiting waveform of which is illustrated in FIG. 4(L)). When the switch SW2 is OFF, the polarity on L2 reverses and the diode D2 functions as a closed switch, and the capacitor C2 is charged by the charge within the inductor L2, which, in turn, continues to create a voltage across the coil load 316B at point 12. The activation of the switches SW1 and SW2 to ON or OFF is mutually exclusive. That is, if one is OFF, then the other is ON. The only time where both switches may be OFF is when there is no main input signal 202. The combination of the activation of the switches over time generates the main output signal 328, an exemplary non-limiting waveform of which is illustrated in FIG. 4(M). It should be noted that two buck converters are used with the amplifier of the present invention in order to be able to maintain the switches SW1 and SW2 OFF when there is no main input signal 202, activate the switches only in a mutually exclusive manner, and to use a single power supply (from the +Rail voltage), rather than the prior art two supply system of +VDD and −VDD (as illustrated in the prior art FIG. 1C). All of which reasons create a very efficient amplifier system.

As illustrated in FIG. 3, the present invention further includes a feedback unit 212 for correction of a main output signal 328 in relation to the main input signal 202. The feedback unit 212 is comprised of a feedback differential amplifier 318 that is coupled with the first and second portions of the load 316, and a phase lag compensation circuit for preventing oscillation. The phase lag compensation circuit is coupled at one end with an output of the feedback differential amplifier 318, and at another end with the input unit 204.

The feedback differential amplifier 318 is comprised of a first negative input terminal coupled with the first portion 316A of the load 316 through a first resistor R4, and a second positive input terminal, which is coupled with the second portion 316B of the load 316 through a set of second resistors R5 and R3 with a voltage divider topography. The feedback differential amplifier 318 further includes a feedback resistor R6 that couples the output at point 14 thereof with the first resistor R4. An exemplary non-limiting waveform of the signal at point 14 is illustrated in FIG. 4(N). The feedback differential amplifier 318 senses the output signal 326 from coil 316A at point 13 and that of signal 324 from coil 316B at point 12, and combines the signals to output a replica of the complete main output signal 328 at point 14. Differential amplifiers and their functionality are very well known.

The phase lag compensation circuit of the feedback unit 212 is comprised of the capacitor C3 coupled in parallel with resistor R7, the combination of which is coupled in series with the resistor R2. The phase lag compensation circuit is for modifying phases of the main output signal 328 in relation to that of the main input signal 202 to avoid oscillations. It should be noted that a feedback loop may oscillate because output at points 13 and 12 of the L1 and C1 filter and L2 and C2 filter have a phase shift lag of up to −180°, and the error amplifier 302 is an inverter that also shifts the phase additionally to −180°. Thus, a −180° phase shift by the L1 and C1 filter or L2 and C2, plus a −180° from the error amplifier 302 results in a −360° phase, which is the perfect formula for an oscillator circuit. Therefore, some method must be used to maintain the phase above the −180° line to avoid oscillations and preserve the circuit stability under the frequency domain. Of course, the method must also preserve or save the required bandwidth intact. Therefore, the capacitor C3 of the phase lag compensation circuit is used to compensate the phase lag due to the L1 and L2 inductors, and the capacitor C4 and resistor R8 maintain the gain of the entire amplifier system below 1, at the resonant point of L1 and L2 inductors, all of which prevent oscillation of the circuit. It should further be noted that L1 and C1 and L2 and C2 also function as low pass filters (or demodulators) that strip off the modulation or carrier frequency generated by the switches SW1 and SW2 at respective points 10 and 11, before the signals are input to the load at points 12 and 13.

As further illustrated in FIG. 3, the amplifier 300 further includes a mute or protection circuit 320, which shuts down the amplifier 300 based on some undesirable condition. When the switch 320 closes, the entire incoming signal from pin 3 is directed to ground. Mute switches 320 and their use in audio systems are well-known. The actuation of the mute switch 320 can be based on many factors, including undesired voltage/current, frequency, timing, etc. For example, if voltage is too low or too high, the mute switch 320 closes to protect the amplifier 300.

FIG. 5 is an exemplary illustration of an amplifier 400 that includes a load with a single coil, in accordance with the present invention, instead of the dual coil illustrated in FIG. 3. The amplifier 400 includes similar corresponding or equivalent components and or interconnections as the amplifier 300 that is shown in FIG. 3, and described above. Therefore, for the sake of brevity, clarity, convenience, and to avoid duplication, the general description of FIG. 5 will not repeat every corresponding or equivalent component and or interconnections that has already been described above in relation to amplifier 300 that is shown in FIG. 3.

Figure 6:
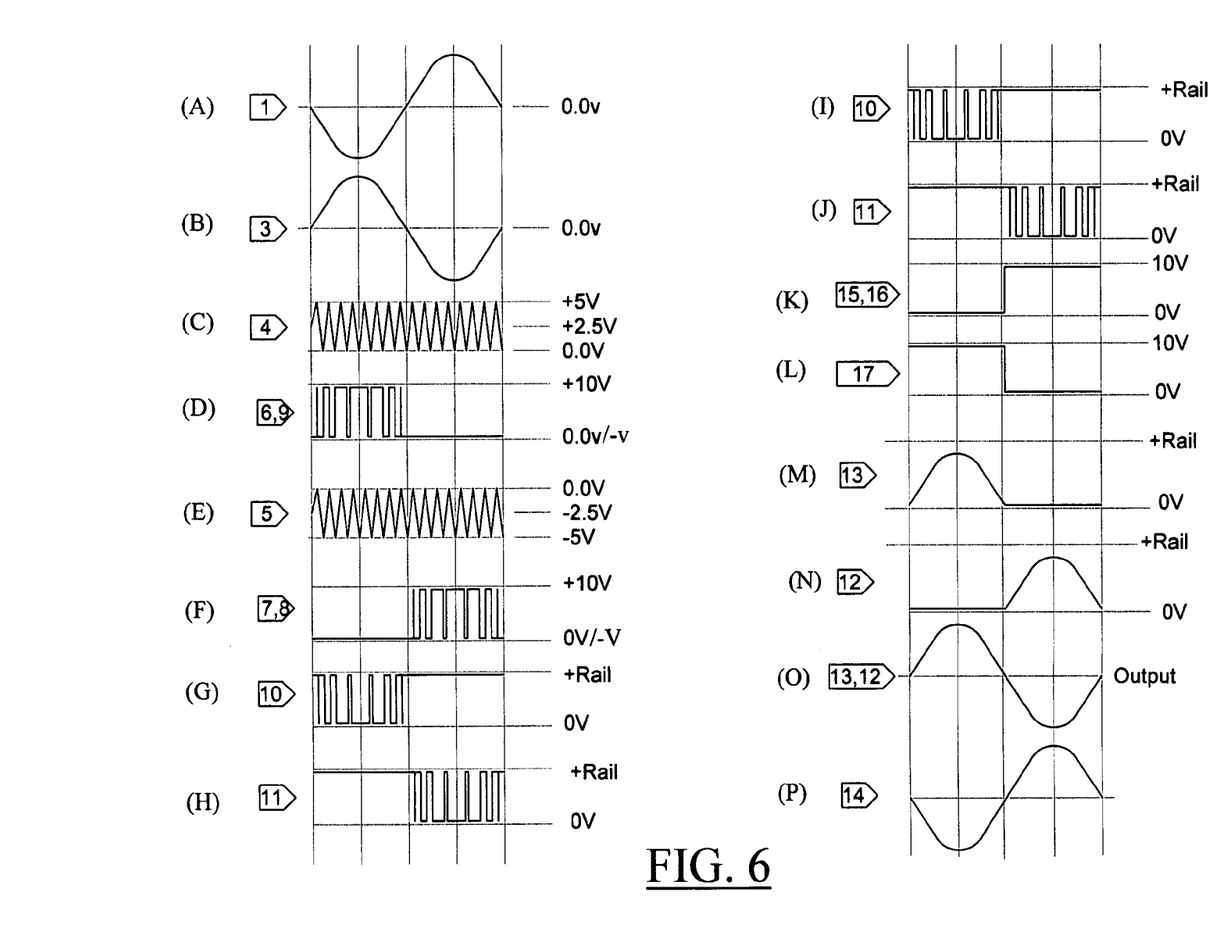
FIGS. 6(A) to 6(P) are exemplary waveform diagrams illustrating the various waveforms at particular points in the circuit of FIG. 5.

As stated above, FIG. 5 is an exemplary detailed schematic illustration of the amplifier 400 in accordance with the present invention, and FIGS. 6(A) to 6(P) are exemplary waveform diagrams illustrating the various waveforms at particular points in the circuit of FIG. 5. As illustrated, a transducer load 402 of the amplifier 400 is comprised of a more common single coil load 423. Further, the first and second switch SW1 and SW2 of the respective first and second voltage converter units 218 and 220 are coupled with a power Rail, rather than ground. In addition, switches SW3 and SW4 are now used to control the signal coil transducer load 402 to function as a dual coil load.

As illustrated, the first output 422 of the error amplifier 302 at point 3 is the inverted, linearly amplified replica of the main input signal 202 at point 1, which is coupled with a first negative input terminal of a polarity enable amplifier 404, with the second positive input terminal of the amplifier 404 coupled with ground. The first output 422 is inverted by the polarity enable amplifier 404 and output at point 15 (an exemplary non-limiting waveform of which is illustrated in FIG. 6(K)). The polarity enable amplifier output at point 15 is input to a buffer gate driver 406, which functions as a current amplifier to generate a signal at point 16 (an exemplary non-limiting waveform of which is illustrated in FIG. 6(K)) to drive the set of switches SW3 and SW4 in a mutually exclusive manner.

During the positive cycle of the first output 422, the switch SW1 is turned to ON, and the switch SW2 is turned to OFF (as described in relation to FIG. 3). During this same cycle, the polarity-enable amplifier 404 inverts the positive cycle of the first output 422. The current of the inverted signal (at point 15) is amplified by the buffer gate driver 406, and that signal (at point 16) is input to both the switch SW3 and an inverter 408. During this instance cycle, the signal at point 16 is negative, therefore, the switch SW3 remains OFF. The signal at point 16 is inverted by the inverter 408 into a positive signal, and output at point 17 (an exemplary non-limiting waveform of which is illustrated in FIG. 6(L)). The signal output at point 17 is coupled with the switch SW4, turning ON the switch SW4. The switch SW4, in turn, grounds the coil 423, which causes the coil 423 to switch or change its polarity. The change in the polarity of the coil causes the transducer load to move, similar to the speaker vibration, to move the diaphragm of the speaker forward or back to produce sound.

During the negative cycle of the first output 422, the switch SW2 is turned to ON, and the switch SW1 is turned to OFF (as described in relation to FIG. 3). During this same cycle, the polarity-enable amplifier 404 inverts the negative cycle of the first output 422. The current of the inverted signal (at point 15) is amplified by the buffer gate driver 406, and that signal (at point 16) is input to both the switch SW3 and an inverter 408. During this instance cycle, the signal at point 16 is positive, therefore, the switch SW3 is turned to ON. The signal at point 16 is inverted by the inverter 408 into a negative signal, and output at point 17. The signal output at point 17 is coupled with the switch SW4, turning OFF the switch SW4. The switch SW3, which is now turned to ON, in turn, grounds the coil 423, which causes the coil 423 to switch or change its polarity. The change in the polarity of the coil causes the transducer load to move, similar to the speaker vibration, to move the diaphragm of the speaker forward or back to produce sound. It should be noted that for both FIGS. 3 and 5, the +Rail provides the actual power or voltage of the speaker. Further, it should be noted that although the first and second switch SW1 and SW2 of the respective first and second voltage converter units 218 and 220 are coupled with a power Rail, rather than ground, this topography can be reversed. However, the preferred method with respect to the amplifier circuit of FIG. 5 with a signal coil load is to have the primary switches SW1 and SW2 coupled with the positive Rail, and the secondary (polarity reversal) switches SW3 and SW4 be coupled with the ground. The mutually exclusive grounding of the switches SW3 and SW4 to reverse the polarity of signal coil provides a much simpler circuit topography.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Stated otherwise, it is to be understood that the phraseology and terminology employed herein, as well as the abstract, are for the purpose of description and should not be regarded as limiting. Therefore, while exemplary illustrative embodiments of the invention have been described, numerous variations and alternative embodiments will occur to those skilled in the art. For example, all switches may be replaced by any type of switch, and should not be limited to those illustrated. The impedances (resistors, capacitors, inductors, etc.) may be replaced by their equivalent impedance values. The coil 423 may comprised of multiple, parallel-connected coils. Such variations and alternate embodiments are contemplated, and can be made without departing from the spirit and scope of the invention.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, parallel, perpendicular, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout this document (and in particular, claims) is not used to show a serial or numerical limitation but instead is used to distinguish or identify the various members of the group.

In addition, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of," "act of," "operation of," or "operational act of" in the claims herein is not intended to invoke the provisions of 35 U.S.C. 112, Paragraph 6.

What is claimed is:

1. An amplifier circuit, comprising:
   an input unit for receiving a main input signal, and for maintaining, and outputting a linearly amplified replica of the main input signal;
   a modulator controller that outputs a mutually exclusive first and second modulated signals from a respective first and second portion of the linearly amplified replica of the main input signal only when the input unit receives the main input signal;
   the first and the second modulated signals driving a voltage converter, with the voltage converter driving a respective first portion of a load and a second portion of the load; and
   a feedback unit for correction of a main output signal in relation to the main input signal;
   the modulator controller includes:
   a first modulator unit that outputs the first modulated signal from the first portion of the linearly amplified replica of the main input signal only when the input unit receives the main input signal; and
   a second modulator unit that outputs the second modulated signal from the second portion of the linearly amplified replica of the main input signal only when the input unit receives the main input signal, with the first and second modulated signal outputs being mutually exclusive;

the first modulator unit is comprised of a first modulator having a first input terminal with a first polarity coupled with a first ramp generator, a second input terminal with a second polarity, opposite the first polarity, coupled with the linearly amplified replica of the main input signal, and a first output terminal; and the second modulator unit is comprised of a second modulator having a third input terminal with the first polarity coupled with the linearly amplified replica of the main input signal, and a fourth input terminal with the second polarity coupled with a second ramp generator, and a second output terminal.

2. The amplifier as set forth in claim 1, wherein:
the input unit is comprised of a comparator comparing the main input signal with the main output signal;
the comparator includes first input coupled to a gain circuit, a second input coupled to ground, and a comparator output coupled to the modulator controller.

3. The amplifier as set forth in claim 2, wherein:
the gain circuit is comprised of a set of impedances.

4. The amplifier as set forth in claim 2, wherein:
the comparator is comprised of a linear amplifier used as an error amplifier.

5. The amplifier as set forth in claim 1, wherein:
the first ramp generator outputs signal values of second polarity that set a modulation frequency of the amplifier; and
the second ramp generator outputs signal values of first polarity that set the modulation frequency of the amplifier.

6. The amplifier as set forth in claim 1, wherein:
the first and the second ramp generators output signals that are of one of a saw tooth wave form and a triangular wave form.

7. The amplifier as set forth in claim 5, wherein:
the first output terminal of the first modulator is coupled with an input of a first buffer that outputs a modulated signal with the second polarity for turning ON and OFF a first switch; and
the second output terminal of the second modulator is coupled with an input of a second buffer that outputs the modulated signal with the first polarity for turning ON and OFF a second switch, with the first and the second switches mutually exclusively turned to ON and OFF.

8. The amplifier as set forth in claim 1, wherein:
a voltage controller is comprised of a buck converter.

9. The amplifier as set forth in claim 8, wherein:
the buck converter is a dual buck converter.

10. The amplifier as set forth in claim 1, wherein:
the first modulator unit is coupled with a first voltage converter with the first modulated signal output driving the first voltage converter;
the second modulator unit is coupled with a second voltage converter with the second modulated signal output driving the second voltage converter.

11. The amplifier as set forth in claim 1, further comprising:
a protection circuit, which shuts down the amplifier based on undesirable condition.

12. The amplifier as set forth in claim 1, wherein:
the feedback unit is comprised of
a feedback differential amplifier that is coupled with the first and second portion of the load; and a
phase lag compensation circuit for preventing oscillation that is coupled at one end with an output of the feedback differential amplifier, and at another end with the first input unit.

13. The amplifier as set forth in claim 12, wherein:
the feedback differential amplifier is comprised of a first input terminal with a first polarity coupled with the first portion of the load through a first impedance, and a second input terminal with a second polarity, which is opposite the first polarity, with the second input terminal coupled with the second portion of the load through a set of second impedances with a voltage divider topography;
the feedback differential amplifier having a feedback impedance that couples the output thereof with the first impedance.

14. The amplifier circuit as set forth in claim 1, wherein the first and the second portion of the load are comprised of at least one single coil, with the modulator controller varying a polarity of the at least one single coil.

* * * * *